United States Patent
Kim et al.

(10) Patent No.: US 10,667,443 B2
(45) Date of Patent: May 26, 2020

(54) ELECTROMAGNETIC WAVE BLOCKING DEVICE HAVING ELECTROMAGNETIC WAVE SHIELDING AND ABSORBING CAPACITY AND MANUFACTURING METHOD THEREFOR

(71) Applicants: KOREA E3TEST INSTITUTE INC., Daegu (KR); Nam Sic Kim, Daegu (KR); Hyun Yu Nam, Daegu (KR)

(72) Inventors: Nam Sic Kim, Daegu (KR); Hyun Yu Nam, Daegu (KR)

(73) Assignees: KOREA E3TEST INSTITUTE INC., Daegu (KR); Nam Sic Kim, Daegu (KR); Hyun Yu Nam, Daegu (KR)

( * ) Notice: Subject to any disclaimer, the term of this patent is extended or adjusted under 35 U.S.C. 154(b) by 278 days.

(21) Appl. No.: 15/562,939

(22) PCT Filed: Mar. 31, 2016

(86) PCT No.: PCT/KR2016/003336
§ 371 (c)(1),
(2) Date: Sep. 29, 2017

(87) PCT Pub. No.: WO2016/159688
PCT Pub. Date: Oct. 6, 2016

(65) Prior Publication Data
US 2018/0092259 A1    Mar. 29, 2018

(30) Foreign Application Priority Data
Mar. 31, 2015    (KR) .................. 10-2015-0045634

(51) Int. Cl.
*H05K 9/00* (2006.01)
*H04B 1/3827* (2015.01)
(Continued)

(52) U.S. Cl.
CPC ........... *H05K 9/0083* (2013.01); *H05K 9/009* (2013.01); *H05K 9/0088* (2013.01);
(Continued)

(58) Field of Classification Search
CPC ...... H01Q 17/00; H01Q 1/526; H01Q 19/005; H01Q 1/245; H01Q 19/10; H01Q 15/14;
(Continued)

(56) References Cited

U.S. PATENT DOCUMENTS 4,408,255 A * 10/1983 Adkins ................ H05K 9/0088
                                                361/689
5,510,792 A *  4/1996 Ono .................... H01Q 17/008
                                                342/4

(Continued)

FOREIGN PATENT DOCUMENTS

JP    H09-074295 A    3/1997
JP    2002-033595 A   1/2002
(Continued)

*Primary Examiner* — Olumide Ajibade Akonai
(74) *Attorney, Agent, or Firm* — KORUS Patent, LLC; Seong Il Jeong

(57) ABSTRACT

The present invention provides an electromagnetic wave blocking device having electromagnetic wave shielding and absorbing capacity. The electromagnetic wave blocking device having electromagnetic wave shielding and absorbing capacity includes: an electromagnetic wave blocking device body part configured such that an identical material (Continued)

is mixed with shielding and absorbing materials or different materials are arranged on both sides of a boundary of their sides to thus enable electromagnetic wave absorption and electromagnetic wave shielding; and an edge electromagnetic wave absorbing part formed along the boundary of the blocking device body part to thus additionally block electromagnetic waves. Furthermore, the present invention provides a method for manufacturing the electromagnetic wave blocking device.

6 Claims, 7 Drawing Sheets

(51) Int. Cl.
  *H01Q 1/52* (2006.01)
  *H01Q 17/00* (2006.01)
  *H01Q 1/24* (2006.01)
(52) U.S. Cl.
  CPC ........... *H05K 9/0092* (2013.01); *H01Q 1/245* (2013.01); *H01Q 1/526* (2013.01); *H01Q 17/00* (2013.01); *H04B 1/3838* (2013.01)
(58) Field of Classification Search
  CPC ...... H01Q 1/52; H04B 1/3838; H04B 1/3888; G01S 7/4813; H05K 9/0007; H05K 9/0045; H05K 9/002; H05K 9/0088; H05K 9/00; H05K 1/0218; H05K 9/0073
  USPC .............................. 455/90.3, 575.5; 343/702
  See application file for complete search history.

(56) References Cited

U.S. PATENT DOCUMENTS

| | | | | |
|---|---|---|---|---|
| 5,565,656 | A * | 10/1996 | Mottahed | H05K 5/0013 174/372 |
| 5,855,988 | A * | 1/1999 | Matsuo | H01O 17/00 342/1 |
| 6,075,977 | A * | 6/2000 | Bayrami | A61N 1/16 343/841 |
| 6,733,869 | B2 * | 5/2004 | Arakawa | B32B 15/08 257/659 |
| 6,869,683 | B2 * | 3/2005 | Sakurai | B32B 25/20 428/447 |
| D745,504 | S * | 12/2015 | Schmidt | D14/250 |
| 2002/0160725 | A1 * | 10/2002 | Toyoda | H01O 1/245 455/575.1 |
| 2007/0196671 | A1 * | 8/2007 | Kobayashi | B82Y 25/00 428/447 |
| 2010/0234081 | A1 * | 9/2010 | Wong | H01O 1/243 455/575.5 |
| 2011/0068283 | A1 * | 3/2011 | Lu | H05K 9/0088 250/515.1 |
| 2013/0109435 | A1 * | 5/2013 | McCaughey | H01O 1/243 455/556.1 |
| 2014/0126139 | A1 * | 5/2014 | Mortensen | G11B 33/1493 361/679.33 |

FOREIGN PATENT DOCUMENTS

| | | |
|---|---|---|
| KR | 10-2000-0068190 A | 11/2000 |
| KR | 10-2007-0010428 A | 1/2007 |
| KR | 10-2008-0105546 A | 12/2008 |
| KR | 10-2013-0014702 A | 2/2013 |
| KR | 10-2014-0077047 A | 6/2014 |

* cited by examiner

ELECTROMAGNETIC WAVE BLOCKING DEVICE HAVING ELECTROMAGNETIC WAVE SHIELDING AND ABSORBING CAPACITY AND MANUFACTURING METHOD THEREFOR

TECHNICAL FIELD

The present invention relates generally to an electromagnetic wave blocking device, and more specifically to an electromagnetic wave blocking device having electromagnetic wave shielding and absorbing capacity, which can implement both electromagnetic wave shielding and electromagnetic wave absorption, and a method for manufacturing the same.

BACKGROUND ART

Generally, an electromagnetic wave refers to a wave in which an electric field and a magnetic field propagate across space while forming a right angle and changing periodically. It is well known that electromagnetic waves are being more widely used due to the development of electrical and electronic engineering.

Furthermore, today, office devices, such as a television set, a computer monitor, etc. are widely used at homes or offices. In particular, in winter, electric heating devices, such as an electric pad, an electric mat, an electric blanket, and an electric stove, are widely used. Moreover, when a user is exposed to the electromagnetic waves of a home appliance, such as an electric bed, an microwave oven, a washing machine, a refrigerator or an electric rice cooker, an office device, an industrial device, or the like, probability that the user has a disease, such as headache, increases, and also there are a lot of disadvantages.

Accordingly, various materials have been developed to absorb and block/remove such electromagnetic waves. As conventional art proposed to develop such materials, there are being applied various schemes, including a scheme in which: rubber having the functions of absorbing and blocking/removing electromagnetic waves is manufactured through injection or extrusion molding after adding ferrite, i.e., an electromagnetic wave blocking/removing material, to a rubber composition, i.e., an insulating material, in the form of powder or chips, or a mat having the functions of absorbing and blocking/removing electromagnetic waves is manufactured through extrusion molding after mixing a particulate electromagnetic wave absorbing agent and a particulate conductive material with any one of rubber and thermoplastic resin; and the rubber or mat is attached to a product which generates electromagnetic waves.

However, the products manufactured using the above schemes are formed by mixing compositions having different specific gravities with each other. In this case, unless the compositions are sufficiently mixed with each other, it is difficult to uniformly distribute the electromagnetic absorbing agent and the conductive material due to the difference between the specific gravities of the compositions. Accordingly, a problem arises in that the functions of absorbing and blocking/removing electromagnetic waves are not uniformly performed.

As a prior art document related to the present invention, there is Korean Utility Model Registration Application Publication No. 20-1998-010576 (May 15, 1998).

DISCLOSURE

Technical Problem

An object of the present invention is to provide an electromagnetic wave blocking device having both electromagnetic wave shielding capacity and electromagnetic wave absorbing capacity, which can implement both electromagnetic wave shielding and electromagnetic wave absorption, and a method for manufacturing the same.

Another object of the present invention is to provide an electromagnetic wave blocking device having both electromagnetic wave shielding capacity and electromagnetic wave absorbing capacity, in which an electromagnetic wave absorbing band made of metal is formed along the edge of an electromagnetic shielding part, thereby improving absorption rate along the edge of the electromagnetic shielding part, and a method for manufacturing the same.

Technical Solution

According to an aspect of the present invention, there is provided an electromagnetic wave blocking device having electromagnetic wave shielding and absorbing capacity.

The electromagnetic wave blocking device having electromagnetic wave shielding and absorbing capacity includes: a blocking device body part made of electromagnetic wave shielding and absorbing materials to thus enable electromagnetic wave absorbing and electromagnetic wave shielding; and an edge electromagnetic wave absorbing part formed along the boundary of the blocking device body part to thus additionally block electromagnetic waves.

It is preferred that the blocking device body part includes: an electromagnetic absorption part configured such that the thickness thereof is adjustable depending on required absorption rate or frequency, and made of an electromagnetic wave absorbing material; and an electromagnetic shielding part configured to have a predetermined thickness.

The electromagnetic absorption part and the electromagnetic shielding part may be coupled to each other via protrusion-depression portions (pyramid- or cone-shape portions, or the like) and an air layer in order to improve a blocking effect.

It is preferred that the electromagnetic wave shielding and absorbing part has: a plate-shaped plastic base material configured to include electromagnetic shielding and absorption powder having an electromagnetic shielding film formed on one surface thereof; and electromagnetic shielding and absorption powder mixed with the plastic base material, and made of metal and an electromagnetic wave absorbing material to thus block and absorb electromagnetic waves.

The electromagnetic shielding and absorption powder is mixed inside the plastic base material.

It is preferred that the electromagnetic shielding and absorption powder is formed by mixing at least two of ferrite, carbon, nickel alloy, amorphous metal, conductive powder, carbon fiber, graphite, sand dust, graphene, and absorbent powder with each other.

It is preferred that the edge electromagnetic wave absorbing part includes a metal band formed along the boundary between the electromagnetic absorption part and the electromagnetic shielding part.

The metal band may be formed from outer surfaces of the electromagnetic absorption part and the electromagnetic shielding part at a location corresponding to an area forming the boundary.

The metal band may be fitted and installed into an installation groove formed on the outer surfaces of the electromagnetic absorption part and the electromagnetic shielding part at the location corresponding to the area forming the boundary.

According to another aspect, there is provided a method for manufacturing an electromagnetic wave blocking device having electromagnetic wave shielding and absorbing capacity, which manufactures the above-described electromagnetic wave blocking device having electromagnetic wave shielding and absorbing capacity.

Advantageous Effects

According to the present invention, electromagnetic wave shielding and electromagnetic wave absorbing may be simultaneously implemented.

Furthermore, according to the present invention, an electromagnetic wave absorbing band made of metal is formed at the edge of an electromagnetic shielding part, so that an electromagnetic wave absorption rate may be improved.

MODE FOR INVENTION

An electromagnetic wave blocking device having electromagnetic wave shielding and absorbing capacity and a method for manufacturing the same will be described below with reference to the accompanying drawings.

Figure 1:
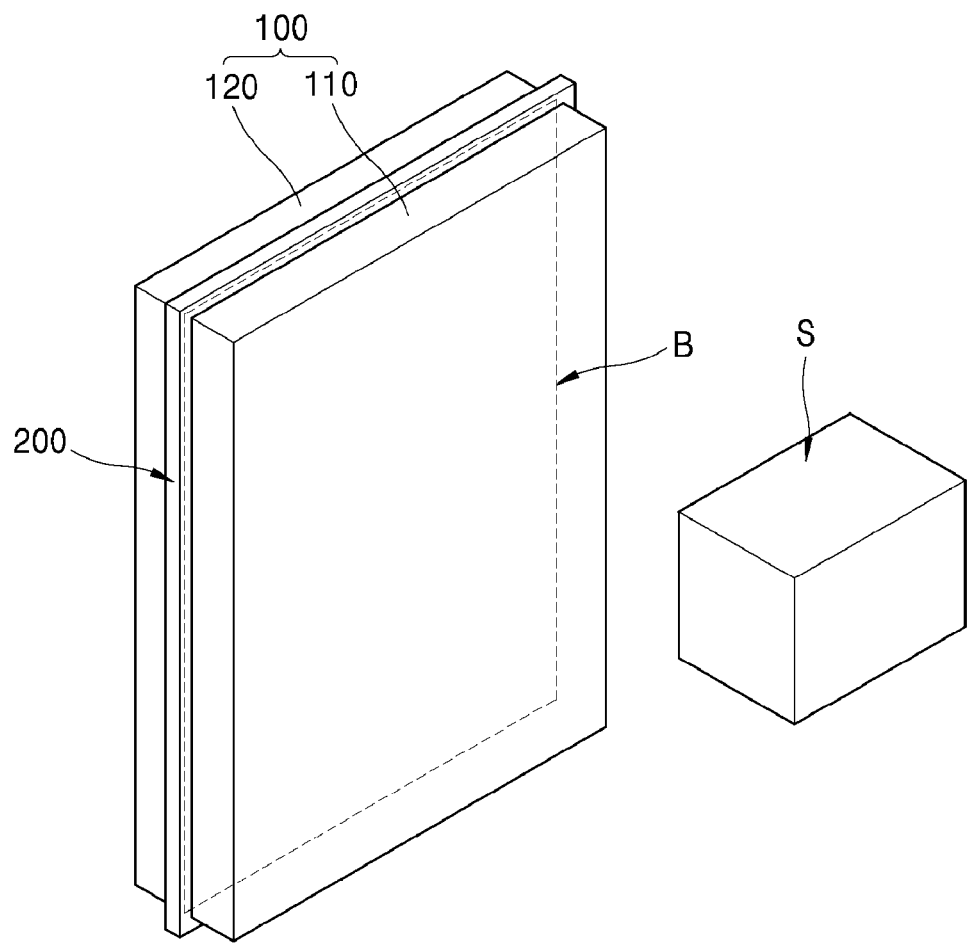
FIG. 1 is a perspective view showing the configuration of an electromagnetic wave blocking device having electromagnetic wave shielding and absorbing capacity according to the present invention.
Figure 2:
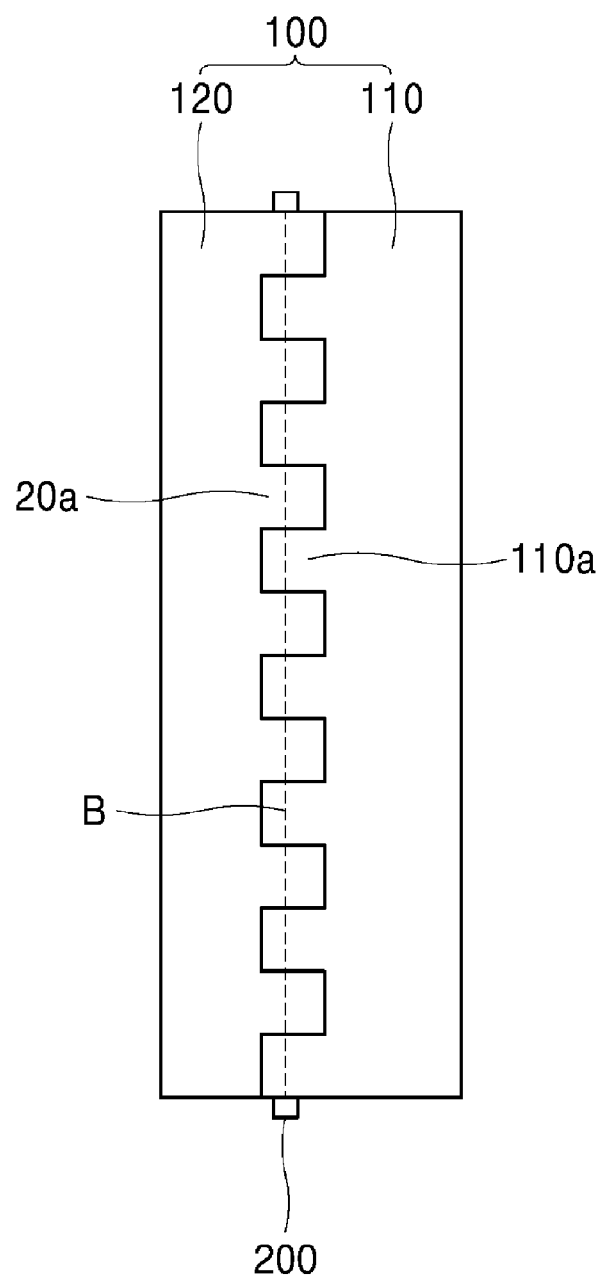
FIG. 2 is a view showing a coupling relationship between an electromagnetic absorption part and an electromagnetic shielding part according to the present invention.
Figure 3:
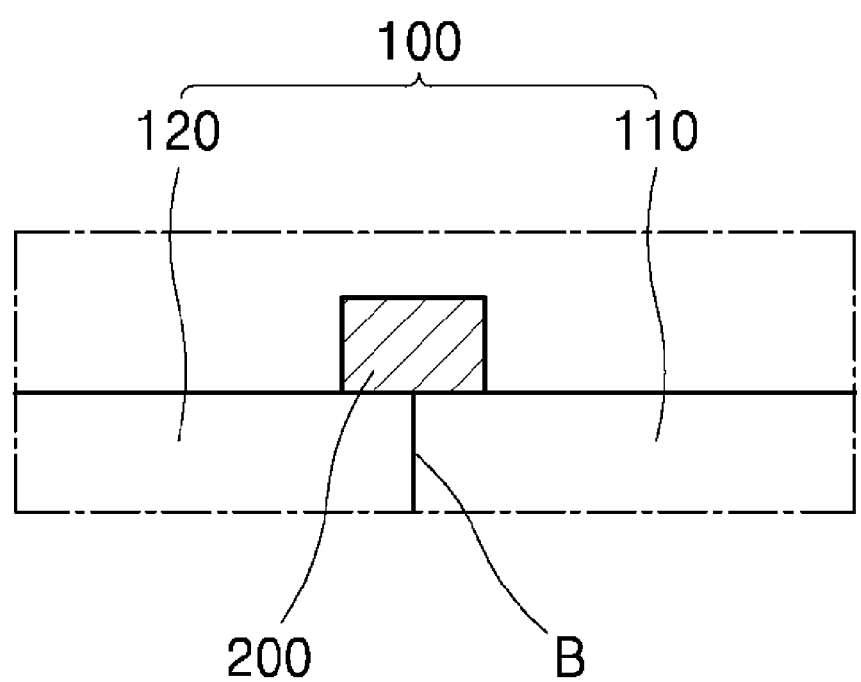
FIG. 3 is a sectional view showing an installation state of an edge electromagnetic wave absorbing part according to the present invention.

FIG. 1 is a perspective view showing the configuration of an electromagnetic wave blocking device having electromagnetic wave shielding and absorbing capacity according to the present invention, FIG. 2a is a view showing a coupling relationship between an electromagnetic absorption part and an electromagnetic shielding part according to the present invention, FIG. 2b is a view showing another coupling relationship between an electromagnetic absorption part and an electromagnetic shielding part according to the present invention, and FIG. 3 is a sectional view showing an installation state of an edge electromagnetic wave absorbing part according to the present invention.

Referring to FIG. 1, an electromagnetic wave blocking device according to the present invention basically includes a blocking device body part 100 and an edge electromagnetic wave absorbing part 200.

The blocking device body part 100 includes an electromagnetic absorption part 110 and an electromagnetic shielding part 120.

The electromagnetic absorption part 110 and the electromagnetic shielding part 120 are formed in plate shapes, and are coupled to each other.

The electromagnetic absorption part 110 and the electromagnetic shielding part 120 may be coupled to each other in a protrusion-depression engagement manner.

The electromagnetic absorption part 110 includes a plastic base material having a plate shape, and electromagnetic shielding and absorption powder.

The plastic base material includes electromagnetic shielding and absorption powder having an electromagnetic shielding film formed on the outer surface thereof.

The electromagnetic shielding and absorption powder is formed by mixing at least two of ferrite, carbon, nickel alloy, amorphous metal, and conductive powder with each other.

The electromagnetic wave shielding and absorbing power is mixed inside the plastic base material.

In this case, the electromagnetic shielding and absorption powder is mixed inside the plastic base material, in which case the density thereof may be gradually increased from the center to the edge thereof.

Meanwhile, the electromagnetic shielding part 120 is formed as a metal thin film or plate, a metal mesh, conductive fiber, a conductive carbon composite, and a conductive film, and is formed in a plate shape.

Referring to FIG. 2, a first protrusion-depression portion 110a having a plate shape is formed on one surface of electromagnetic absorption part 110 configured as described above.

A second protrusion-depression portion 120a having a plate shape is formed on one surface of the electromagnetic shielding part 120.

The first and second protrusion-depression portions 110a and 120a are formed to engage tightly with each other.

The first and second protrusion-depression portions 110a and 120a may be formed in a pyramidal shape, a conical shape, or a triangular pyramidal shape, and may be formed such that the widths thereof are decreased from the electromagnetic shielding part 120 along the electromagnetic absorption part 110.

In this case, a conductive adhesive (not shown) having a predetermined thickness is applied onto one surface of the electromagnetic absorption part 110 or one surface of the electromagnetic shielding part 120.

Accordingly, as the first and second protrusion-depression portions 110a and 120a engage with each other, the electromagnetic absorption part 110 and the electromagnetic shielding part 120 are coupled with each other.

Accordingly, a boundary B is formed between the electromagnetic absorption part 110 and the electromagnetic shielding part 120.

Furthermore, the edge electromagnetic wave absorbing part 200 according to the present invention is formed as a metal band 200. Reference numeral "200" is identically used for both the edge electromagnetic wave absorbing part and the metal band.

The metal band 200 may be adhered to the outer surface of the blocking device body part 100 via a separate conductive adhesive such that the metal band 200 is located along the boundary B.

In this case, the metal band 200 may protrude from the outer surface of the blocking device body part 100 and have a curved edge portion so that introduced electromagnetic waves can be dispersed to the outside and thus blocked.

In addition, embossed protrusions (not shown) may be formed on the outer surface of the metal band 200.

It is preferred that the thickness of the electromagnetic absorption part 110 according to the present invention is 0.001 mm or more and the thickness of the electromagnetic shielding part 120 ranges from 0.001 to 2 mm. The thicknesses are not limited thereto depending on usage.

In this case, absorption capacity (absorption rate) is 0.2 dB or more in a frequency range from 0 to 1 GHz and is 1 dB or more in a frequency range higher than 1 GHz, and shielding capacity is 30 dB or more.

Furthermore, an air layer 110b having a predetermined volume is formed inside the electromagnetic absorption part 110.

One air layer 110b may be formed or a plurality of air layers 110b may be formed in a plurality of layers.

Since the air layer 110b is formed, advantages arise in that the blocking device body part 100 itself may become lightweight, and the rate of absorption of electromagnetic waves may be improved.

Referring to the above configuration, an electromagnetic wave source S may be located adjacent to the electromagnetic absorption part 110, electromagnetic waves generated by the electromagnetic wave source S may be absorbed by the electromagnetic absorption part 110, and the electromagnetic waves may be efficiently prevented from being discharged to the outside by the electromagnetic shielding part 120 coupled to a side opposite to the electromagnetic absorption part 110.

In addition, the electromagnetic waves may be efficiently prevented from leaking from the edge of the blocking device body part 100 by the metal band 200 installed along the boundary of the blocking device body part 100.

Figure 4:
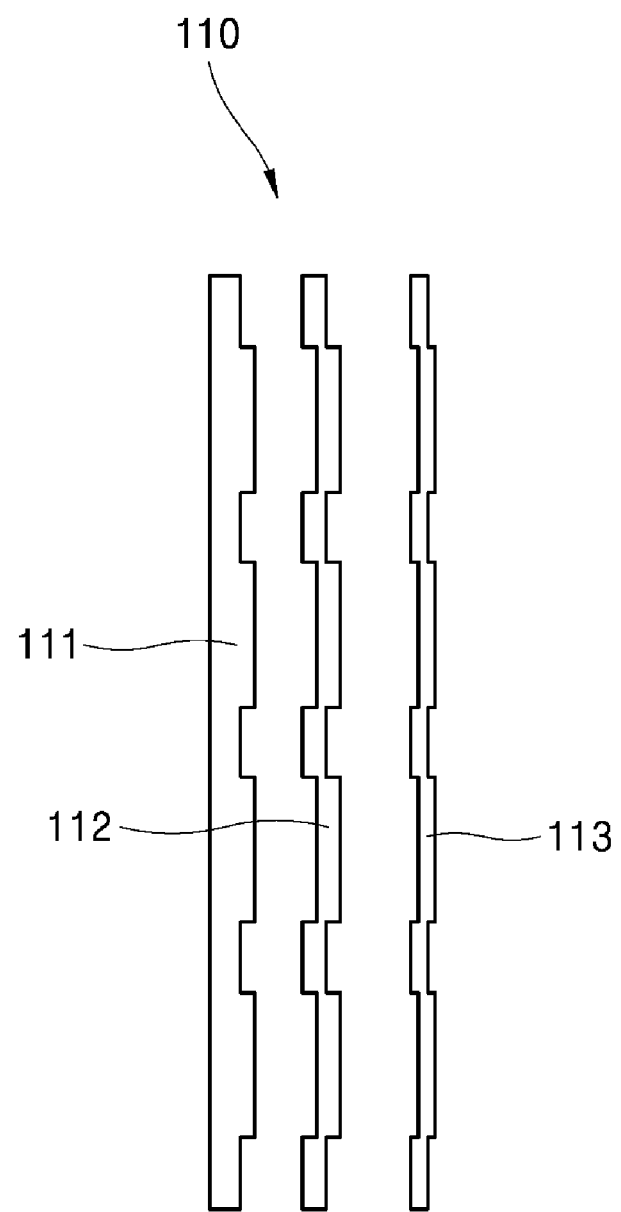
FIG. 4 is a view showing an example of a configuration in which the thickness of an electromagnetic absorption part is adjustable according to the present invention.

FIG. 4 is a view showing an example of a configuration in which the thickness of an electromagnetic absorption part is adjustable according to the present invention.

Referring to FIG. 4, an electromagnetic absorption part 110 according to the present invention may include a plurality of absorption plates 111, 112, and 113.

The thicknesses of the plurality of absorption plates 111, 112, and 113 may be different from each other.

For example, first, second, . . . , and n-th absorption plates are configured, and the thicknesses of the absorption plates are determined depending on the number and permittivity of coupled absorption plates.

The thickness of the electromagnetic absorption part 110 is determined depending on the frequency and absorption rate of a target to be blocked.

Each of the plurality of absorption plates 111, 112, and 113 has a sliding line and a sliding groove into which a sliding line is fitted, and thus the plurality of absorption plates 111, 112, and 113 can be slidably fitted into each other.

Furthermore, each of the plurality of absorption plates 111, 112, and 113 has a plurality of fitting protrusions and a plurality of fitting grooves into which a plurality of fitting protrusions is fitted, and thus the plurality of absorption plates 111, 112, and 113 can be fitted into each other.

Figure 5:
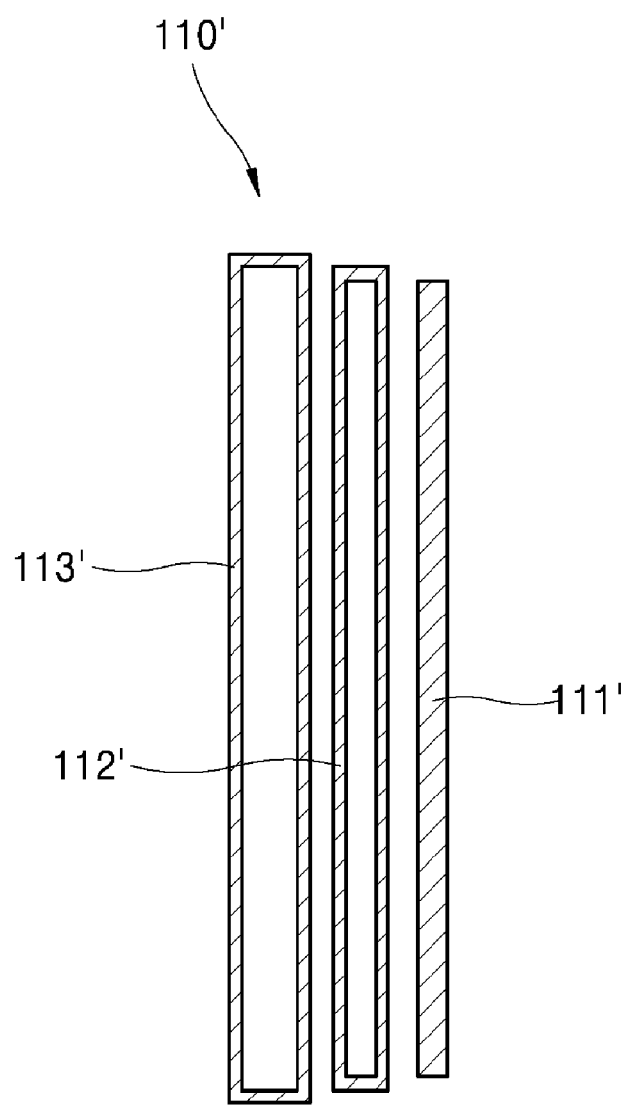
FIG. 5 is a view showing another example of a configuration in which the thickness of an electromagnetic absorption part is adjustable according to the present invention.

FIG. 5 is a view showing another example of a configuration in which the thickness of an electromagnetic absorption part is adjustable according to the present invention.

Referring to FIG. 5, an electromagnetic absorption part 110' according to the present invention includes a plurality of absorption plates 111', 112', and 113', in which case the absorption plates 111', 112', and 113' have hollow cavities and different sizes.

For example, the first absorption plate 111' may be inserted and fitted into the hollow cavity of the second absorption plate 112', and the second absorption plate 112' may be inserted and fitted into the hollow cavity of the third absorption plate 113'.

In this manner, the thickness of the electromagnetic absorption part 110' may be variably adjusted depending on the number of coupled absorption plates.

In this case, it is preferred that the first absorption plate 111', i.e., a first absorption plate, is formed in a hollow-free shape.

Although not shown in the drawing, a conductive adhesive is applied between the absorption plates, in which case the conductive adhesive may further include electromagnetic shielding and absorption powder.

Figure 6:
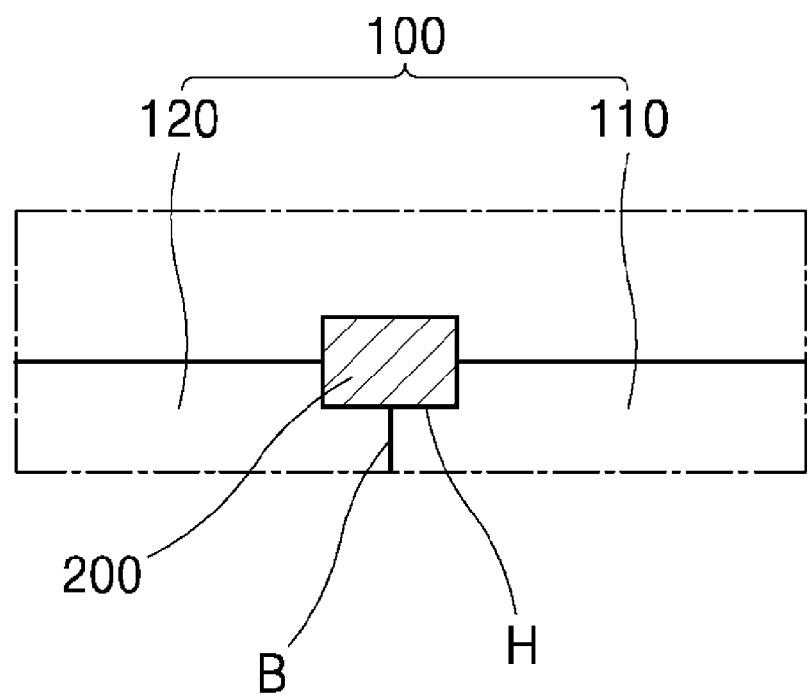
FIG. 6 is a view showing an example in which an edge electromagnetic wave absorbing part is fitted into an installation groove and is installed in a protruding form according to the present invention.

FIG. 6 is a view showing an example in which an edge electromagnetic wave absorbing part is fitted into an installation groove and is installed in a protruding form according to the present invention.

Referring to FIG. 6, an installation groove H is formed along an edge at a location corresponding to the boundary of the blocking device body part 100.

Halves of the installation groove H are formed in the electromagnetic shielding part 120 and the electromagnetic absorption part 110, respectively, along the boundary B.

The above-described metal band 200 may be inserted and fitted into the installation groove H.

In this case, the metal band 200 is fitted into the installation groove H, in which case the outer surface of the metal band 200 may define the same plane the an outer surface of the blocking device body part 100 or may protrude from the outer surface of the blocking device body part 100.

Furthermore, although not shown in the drawing, a conductive adhesive including conductive shielding powder may be further applied into the installation groove H.

Figure 7:
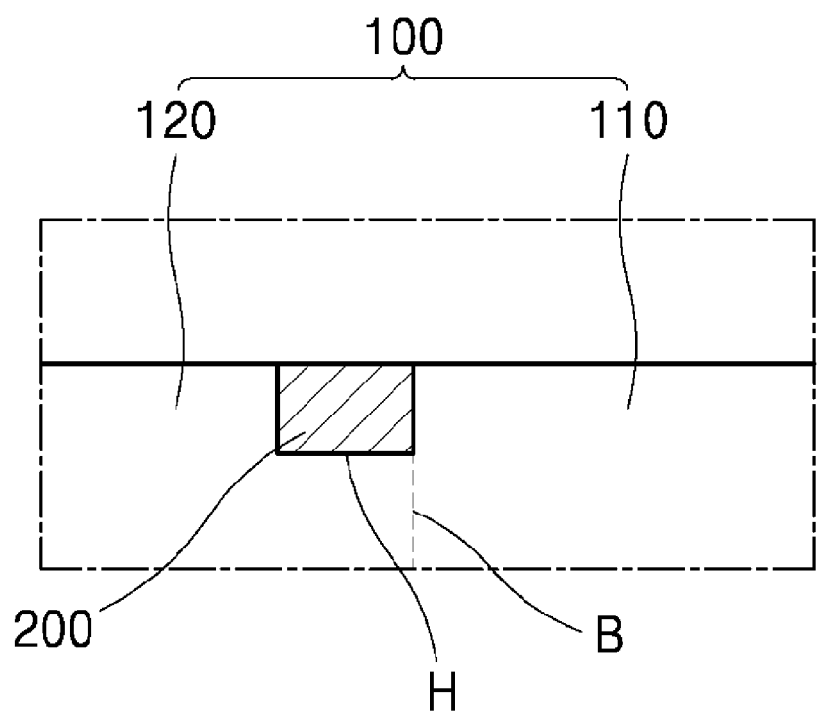
FIG. 7 is a view showing an example in which an edge electromagnetic wave absorbing part is fitted into an installation groove formed in an electromagnetic shielding part and is installed in a non-protruding form according to the present invention.
Figure 8:
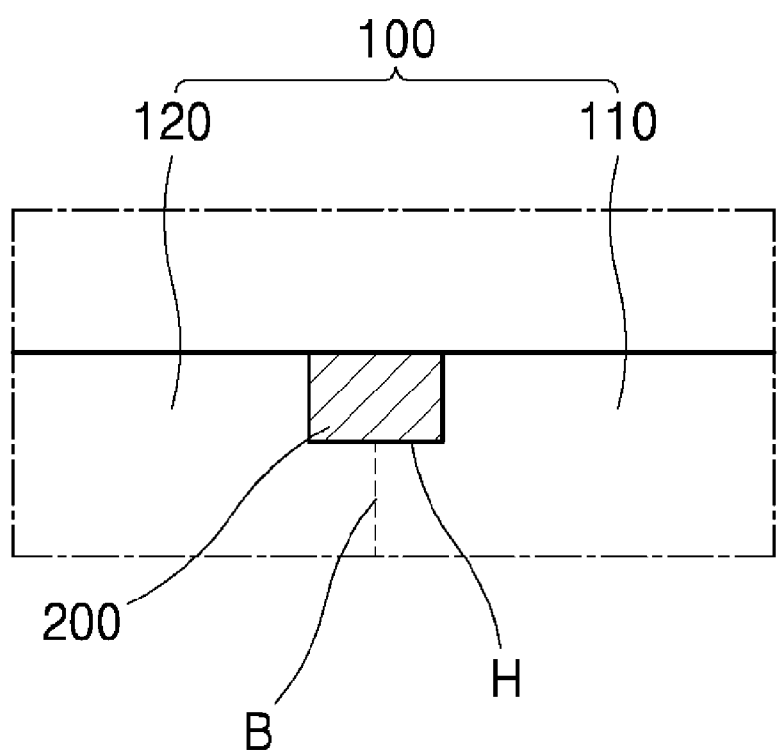
FIG. 8 is a view showing an example in which an edge electromagnetic wave absorbing part is fitted into an installation groove formed along a boundary and is installed in a non-protruding form according to the present invention.

FIG. 7 is a view showing an example in which an edge electromagnetic wave absorbing part is fitted into an installation groove formed in an electromagnetic shielding part and is installed in a non-protruding form according to the present invention, and FIG. 8 is a view showing an example in which an edge electromagnetic wave absorbing part is fitted into an installation groove formed along a boundary and is installed in a non-protruding form according to the present invention.

Referring to FIG. 7, an installation groove is formed by cutting out the electromagnetic shielding part along an edge, and thus the installation groove is exposed to the boundary.

The metal band according to the present invention is inserted and fitted into the installation groove, and the outer surface of the metal band is installed in a non-protruding form to define the same plane as the outer surface of the blocking device body part.

Furthermore, referring to FIG. 8, halves of the installation groove are formed in the electromagnetic shielding part and the electromagnetic absorption part, respectively, along a boundary and are formed by cutting out the electromagnetic shielding part and the electromagnetic absorption part along their edges to be exposed to the boundary.

The metal band according to the present invention is inserted and fitted into the installation groove, and the outer surface of the metal band is installed in a non-protruding form to define the same plane as the outer surface of the blocking device body part.

As described above, the embodiments according to the present invention have an advantage in that both electromagnetic wave shielding and electromagnetic wave absorption can be implemented via the above-described configurations and effects.

Furthermore, the embodiments according to the present invention have an advantage in that an electromagnetic wave absorbing band made of metal is formed along the edge of the electromagnetic absorption part, and thus the absorption rate at the edge of the electromagnetic absorption part can be improved.

Meanwhile, although not shown in the drawing, a vertical through hole may be further formed in the edge of the blocking device body part 100.

When the above-described through hole is formed, it is preferred that the through hole is perforated to have a hole size which prevents the operating frequency of an electronic device from exiting to the outside.

Accordingly, only a high frequency having a wavelength smaller than the operating frequency exits through the through hole, and thus a shielding effect is further enhanced at a low frequency.

Furthermore, a ring-shaped member made of a separate electromagnetic wave blocking material may be fitted into the through hole, and may adjust the size of the hole.

Although the specific embodiments of the electromagnetic wave blocking device having both electromagnetic wave shielding and absorbing capacity according to the present invention have been described above, it will be apparent that various modifications may be made without departing from the scope of the present invention.

Therefore, the scope of the present invention should not be limited to the described embodiments, and should be defined based on not only the appended claims but also equivalents thereto.

In other words, it should be understood that the above-described embodiments are not restrictive but illustrative in all aspects, and it should be appreciated that the scope of the present invention is defined by the appended claims rather than the detailed description and all alterations or modifications derived from the meanings and the scope of the appended claims and concepts equivalent thereto are included in the scope of the present invention.

The invention claimed is:

1. An electromagnetic wave blocking device having electromagnetic wave shielding and absorbing capacity, the electromagnetic wave blocking device comprising:
    an electromagnetic wave blocking device body part configured such that materials having different shielding and absorbing characteristics are arranged on both sides of a boundary of their coupling portions or an identical material is mixed with shielding and absorbing materials to thus enable electromagnetic wave absorption and electromagnetic wave shielding; and
    an edge electromagnetic wave absorbing part formed along the boundary of the blocking device body part to thus additionally reduce electromagnetic waves, wherein the blocking device body part comprises:
    a plate-shaped electromagnetic absorption part made of an electromagnetic wave absorbing material mixed inside the identical material or having a preset thickness; and
    a plate-shaped electromagnetic shielding part coupled to one surface of the electromagnetic absorption part, and configured such that the mixed material or a thickness thereof is adjustable depending on a frequency of a blocking target.

2. The electromagnetic wave blocking device of claim 1, wherein the electromagnetic absorption part and the electromagnetic shielding part are flat plates or are coupled to each other in a protrusion-depression engagement manner.

3. The electromagnetic wave blocking device of claim 1, wherein:
    the electromagnetic wave shielding and absorbing part comprises:
    a plate-shaped base material configured to include electromagnetic shielding and absorption powder having an electromagnetic shielding film formed on an outer surface of the base material; and
    the electromagnetic shielding and absorption powder mixed with the base material, and made of metal and an electromagnetic wave absorbing material to thus block and absorb electromagnetic waves;
    the electromagnetic wave blocking device has the electromagnetic shielding film made of conductive metal and fiber, conductive paint, and a composite, and is formed by including electromagnetic wave absorbing powder in the plate-shaped base material while using the electromagnetic shielding film as a boundary;
    the electromagnetic wave shielding and absorbing part is mixed with the base material, and is mixed with an electromagnetic wave shielding material and an electromagnetic wave absorbing material to thus simultaneously block and absorb electromagnetic waves;
    the electromagnetic shielding and absorption powder is formed by being mixed inside the base material; and
    the electromagnetic shielding and absorption powder is formed by mixing at least two of organic/inorganic materials, including ferrite, carbon, nickel alloy, amorphous metal, and sand dust, with each other.

4. The electromagnetic wave blocking device of claim 1, wherein the edge electromagnetic wave absorbing part comprises a metal band formed along the boundary between the electromagnetic absorption part and the electromagnetic shielding part, and is added to improve an electromagnetic wave absorbing performance.

5. The electromagnetic wave blocking device of claim 1, wherein the blocking device body part is configured such that an outer skin includes at least any one of artificial leather including synthetic leather, natural leather, and synthetic fiber (polyurethane, or the like) and is formed in the electromagnetic absorption part and the electromagnetic shielding part.

6. A method for manufacturing an electromagnetic wave blocking device having electromagnetic wave shielding and absorbing capacity, which manufactures the electromagnetic wave blocking device having electromagnetic wave shielding and absorbing capacity set forth in claim 1.

* * * * *